United States Patent
Hong et al.

(10) Patent No.: US 8,558,371 B2
(45) Date of Patent: Oct. 15, 2013

(54) METHOD FOR WAFER LEVEL PACKAGE AND SEMICONDUCTOR DEVICE FABRICATED USING THE SAME

(75) Inventors: JiSun Hong, Hwasung (KR); Taeje Cho, Hwasung (KR); Un-Byoung Kang, Hwasung (KR); Hyuekjae Lee, Hwasung (KR); Youngbok Kim, Hwasung (KR); Hyung-sun Jang, Hwasung (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 145 days.

(21) Appl. No.: 13/011,286

(22) Filed: Jan. 21, 2011

(65) Prior Publication Data

US 2011/0233706 A1    Sep. 29, 2011

(30) Foreign Application Priority Data

Mar. 23, 2010    (KR) .................. 10-2010-0025905

(51) Int. Cl.
*H01L 23/12* (2006.01)

(52) U.S. Cl.
USPC ...... 257/704; 257/701; 257/710; 257/E23.18; 257/E23.181; 257/E23.183; 257/E23.179; 257/E23.128; 438/462; 438/464; 438/118; 438/113

(58) Field of Classification Search
USPC ............. 438/462, 464, 118, 110, 113, 33, 68; 257/704, 710, E23.18, E23.181, 257/E23.182, E23.179, E23.128, 701
See application file for complete search history.

(56) References Cited

U.S. PATENT DOCUMENTS

| | | | |
|---|---|---|---|
| 7,119,001 B2 | 10/2006 | Kang | |
| 7,479,455 B2 | 1/2009 | Jeong et al. | |
| 2005/0074912 A1* | 4/2005 | Yamauchi et al. | 438/26 |
| 2006/0202117 A1* | 9/2006 | Maeda et al. | 250/239 |
| 2007/0042527 A1* | 2/2007 | Tuckerman et al. | 438/106 |
| 2008/0290479 A1* | 11/2008 | Hong et al. | 257/666 |
| 2009/0267209 A1* | 10/2009 | Shizuno | 257/686 |

FOREIGN PATENT DOCUMENTS

| | | |
|---|---|---|
| JP | 2005-333101 A | 12/2005 |
| KR | 10-0604049 A | 3/2006 |
| KR | 2006-0085848 A | 7/2006 |

* cited by examiner

*Primary Examiner* — Kimberly Rizkallah
*Assistant Examiner* — Maria Ligai
(74) *Attorney, Agent, or Firm* — Harness, Dickey & Pierce, P.L.C.

(57) ABSTRACT

Provided is a wafer level packaging method and a semiconductor device fabricated using the same. In the method, a substrate comprising a plurality of chips is provided. An adhesive layer is formed on the substrate corresponding to boundaries of the plurality of chips. A cover plate covering an upper portion of the substrate and having at least one opening exposing the adhesive layer or the substrate at the boundaries among the plurality of chips is attached to the adhesive layer.

16 Claims, 11 Drawing Sheets

METHOD FOR WAFER LEVEL PACKAGE AND SEMICONDUCTOR DEVICE FABRICATED USING THE SAME

CROSS-REFERENCE TO RELATED APPLICATIONS

This U.S. non-provisional patent application claims priority under 35 U.S.C. §119 to Korean Patent Application No. 10-2010-0025905, filed on Mar. 23, 2010, in the Korean Intellectual Property Office (KIPO), the entire contents of which are hereby incorporated by reference.

BACKGROUND

1. Field

Example embodiments of the inventive concepts relate to a method for wafer level packaging and a semiconductor device fabricated using the same, and more particularly, to a wafer level package module and a semiconductor device manufactured using the same, which can package a plurality of semiconductor chips at a wafer level.

2. Description of the Related Art

In recent years, studies on packages of semiconductor integrated circuits have advanced to chip-size packages that can reduce the size of packages to a semiconductor chip level while maintaining the characteristics of a bare chip. Regarding chip size packages, forming of solder balls after a chip pad is rewired in a chip surface is called a wafer level chip size package. In the wafer level chip size package, chips are directly mounted in a circuit board by a manner called a flip chip, and the solder balls formed on the rewired circuit of a chip are coupled to a conductive pad of the circuit board. Semiconductor chips comprising image sensors such as Charge Coupled Devices (CCD) and Complementary Metal-Oxide Semiconductors (CMOS) are being packaged with glass at an upper portion.

SUMMARY

The present disclosure provides a method for forming a wafer level package and a semiconductor device fabricated using the same, which can enhance or maximize productivity by employing cost-saving package materials.

The present disclosure also provides a method for forming a wafer level package and a semiconductor device fabricated using the same, which can enhance or maximize production yield by preventing a bending defect of a wafer in a high-temperature process after packaging.

The present disclosure also provides a method for forming a wafer level package and a semiconductor device fabricated using the same, which can enhance or maximize production yield by preventing a scratch in a taping process after packaging.

Example embodiments of the inventive concepts provide a wafer level package method that may include forming an adhesive layer on a substrate, the substrate including a plurality of chips and the adhesive layer is formed on boundaries of the plurality of chips, and attaching a cover plate to the substrate via the adhesive layer, the cover plate including at least one opening exposing at least one of the adhesive layer and the substrate at the boundaries of the plurality of chips.

Example embodiments of the inventive concepts provides a semiconductor device that may include an adhesive layer on a pad region of a substrate, the substrate including an active pixel sensor region adjacent to the pad region, and a cover plate covering an upper portion of the substrate, the cover plate covering the adhesive layer and having at least one protrusion protruding above an upper planer surface of the cover plate.

Example embodiments of the inventive concepts provide a wafer level packaging method comprising: providing a substrate comprising a plurality of chips; forming an adhesive layer on the substrate corresponding to boundaries among the plurality of chips; and attaching a cover plate covering an upper portion of the substrate and having at least one opening exposing the adhesive layer or the substrate at the boundaries among the plurality of chips to the adhesive layer.

In some example embodiments, the cover plate may comprise plastic.

In other example embodiments, the plastic may comprise at least one of polycarbonate, Fiber Reinforced Plastic (FRP), and Carbon Fiber Reinforced Plastic (CFRP).

In still other example embodiments, the method may further comprise forming a rewiring pattern and a through electrode exposed under the substrate after attaching the cover plate on the substrate.

In even other example embodiments, the opening may comprise line holes discontinuously formed along the boundaries among the plurality of chips.

In yet other example embodiments, the line holes may be formed at four sides of the plurality of chips having a rectangular shape.

In further example embodiments, wherein the line holes may restrict shrinkage and expansion of the cover plate in the plurality of chips.

In still further example embodiments, the line holes may have a mesh shape over the cover plate.

In even further example embodiments, the cover plate further may comprise at least one protrusion formed at a portion where the line holes cross each other.

In yet further embodiments, the protrusion may be formed at corners of the plurality of chips.

In much further example embodiments, the method may further comprise seating the protrusion of the cover plate on a chuck, and then attaching a tape on an undersurface of the substrate.

In still much further example embodiments, the protrusion may space a planar surface of the cover plate from the chuck, and prevent a scratch of the planar surface by the chuck.

In even much further example embodiments, the protrusion may be more intensively disposed at edges of the substrate and the cover plate than a center thereof.

In yet much further example embodiments, the protrusion may have at least one groove that is formed in a direction in which the line holes adjacent to each other are connected.

In yet much further example embodiments, the groove may be formed in a cross shape at the protrusion.

In yet much further example embodiments, the method may further comprise dicing the substrate into the plurality of chips along the line holes.

In yet much further example embodiments, the protrusion may be removed upon dicing of the plurality of chips.

In other example embodiments of the inventive concepts, semiconductor devices comprise: a substrate comprising an active pixel sensor region and a pad region; an adhesive layer disposed on the substrate of the pad region; and a cover plate covering an upper portion of the substrate over the adhesive layer and having at least one protrusion protruding to a higher level in the pad region than in the active pixel sensor region.

In some example embodiments, the cover plate may comprise at least one of polycarbonate, Fiber Reinforced Plastic (FRP), and Carbon Fiber Reinforced Plastic (CFRP).

In other example embodiments, the cover plate may comprise edge portions disposed at the outside of corners of the pad region.

BRIEF DESCRIPTION OF THE DRAWINGS

The accompanying drawings are comprised to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION OF THE EXAMPLE EMBODIMENTS

Figure 1A:
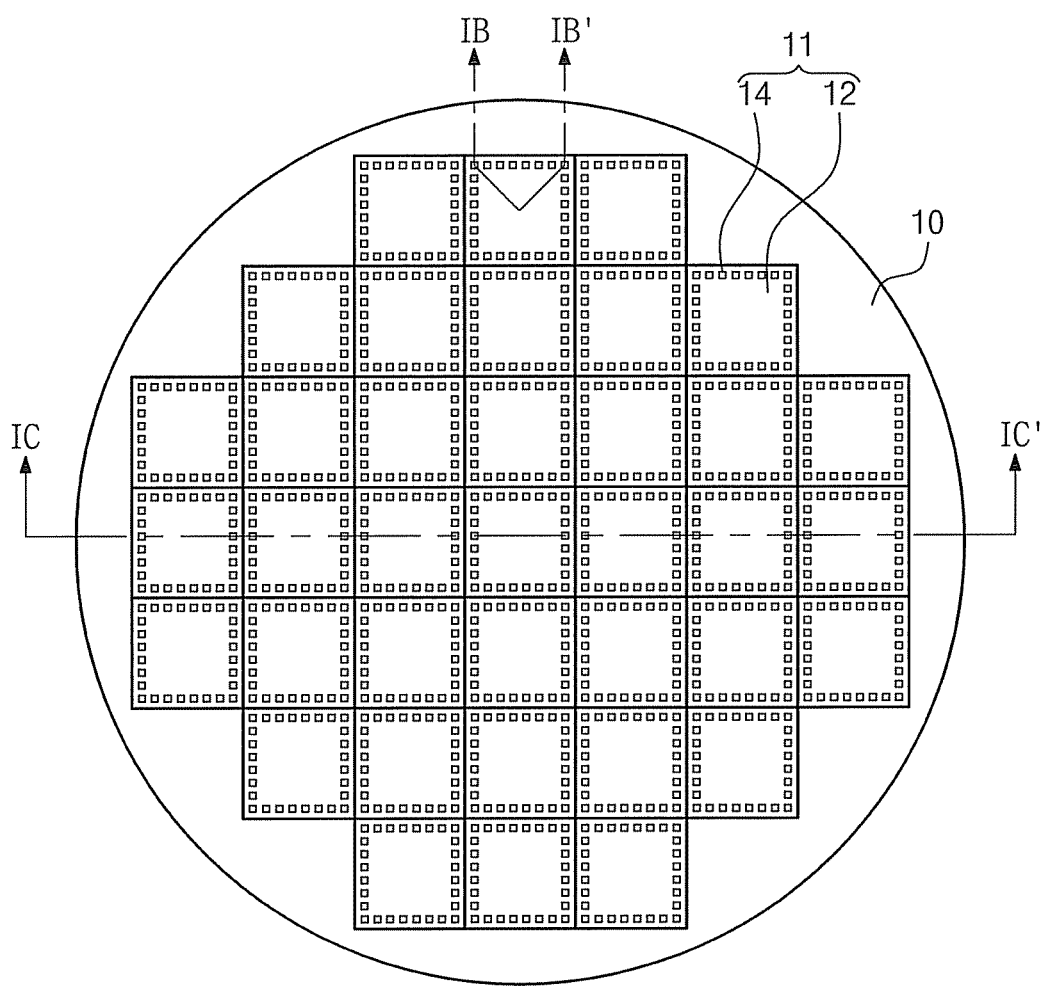
FIG. 1A is a diagram illustrating a wafer shown to describe a wafer level packaging method according to an example embodiment of the inventive concepts.

Hereinafter, example embodiments of the inventive concepts will be described in detail with reference to the accompanying drawings. Advantages and features of the example embodiments of the inventive concepts, and implementation methods thereof will be clarified through following the example embodiments described with reference to the accompanying drawings. The inventive concepts may, however, be embodied in different forms and should not be construed as limited to the example embodiments set forth herein. Rather, the example embodiments are provided so that this disclosure will be thorough and complete, and will fully convey the scope of the inventive concepts to those skilled in the art. Further, the inventive concepts are only defined by scopes of claims. Like reference numerals refer to like elements throughout.

In the following description, the technical terms are used only for explaining a specific example embodiment while not limiting the inventive concepts. The terms of a singular form may comprise plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since example embodiments are provided below, the order of the reference numerals given in the description is not limited thereto.

FIGS. 1A through 10C are cross-sectional views illustrating a wafer level packaging method according to an example embodiment of the inventive concepts.

Figure 1B:
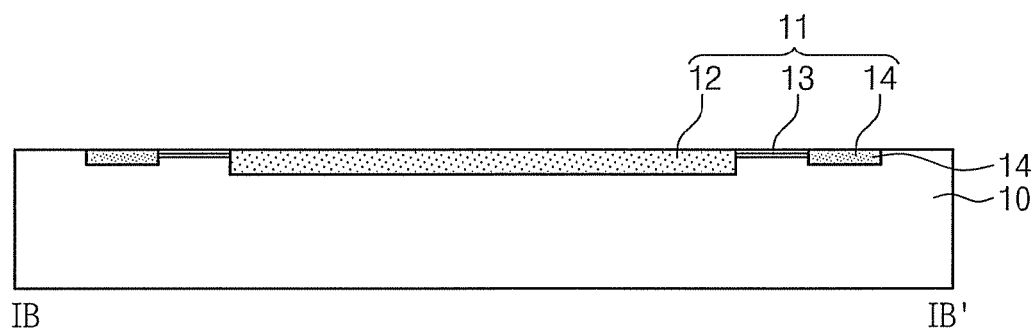
FIGS. 1B and 1C are cross-sectional views taken along lines IB-IB' and IC-IC' of FIG. 1A.
Figure 1C:
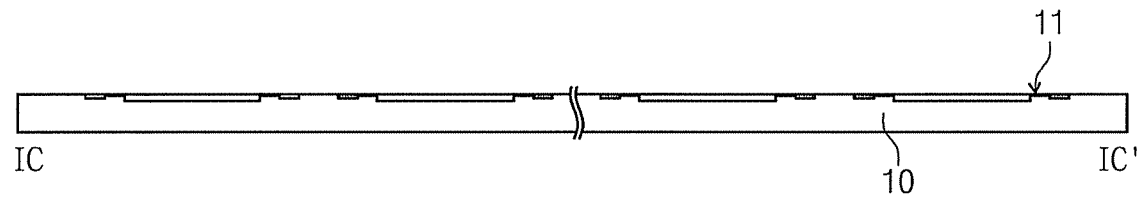

Referring to FIGS. 1A through 1C, a wafer 10 comprising a plurality of semiconductor chips 11 may be provided. Here, the wafer 10 may comprise silicon and the wafer 10 may have a diameter of about 20 cm. The silicon may have a thermal expansion coefficient of about 7.6 ppm/K. In example embodiments, about 300 to 800 semiconductor chips 11 may be mounted in the wafer 10 having a diameter of about 20 cm, however, example embodiments are not limited thereto as there may be more than 800 semiconductor chips or less than 300 semiconductor chips mounted in the wafer 10. Furthermore, the wafer 10, in accordance with example embodiments, may be smaller or larger than 20 cm. The plurality of semiconductor chips 11 may comprise image sensor chips. For example, each semiconductor chip 11 may comprise Active Pixel Sensors (APS) region 12 formed at the center thereof and a plurality of pad electrodes 14 formed around the APS region 12. The APS region 12 and the plurality of pad electrodes 14 may be electrically connected by metal interconnection 13. The APS region 12 and the pad electrode 14 may be formed on the wafer 10 through processes of known technologies, for example, thin film deposition processes, ion implantation processes, and photolithography processes. Detailed description of these processes will be omitted herein.

Figure 2A:
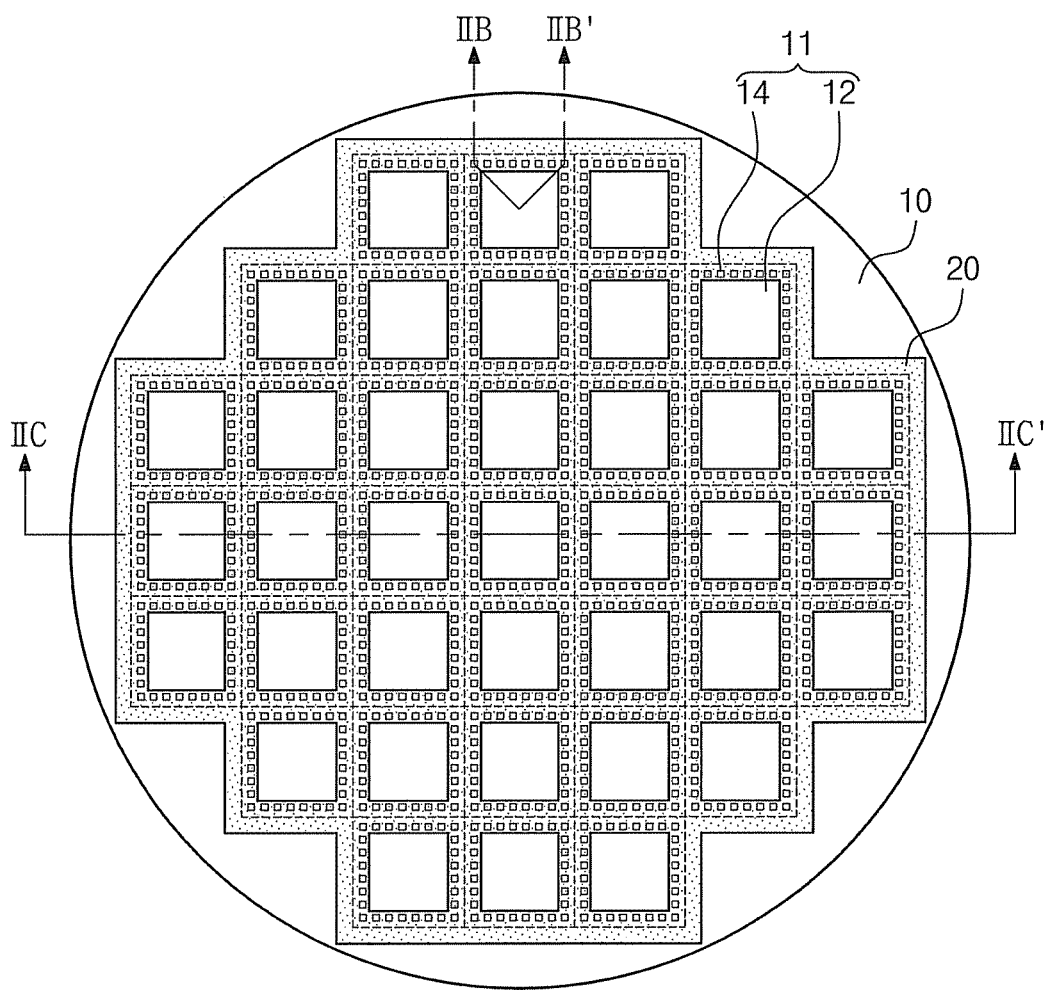
FIG. 2A is a diagram illustrating a wafer and an adhesive layer shown to describe a wafer level packaging method according to an example embodiment of the inventive concepts.
Figure 2B:
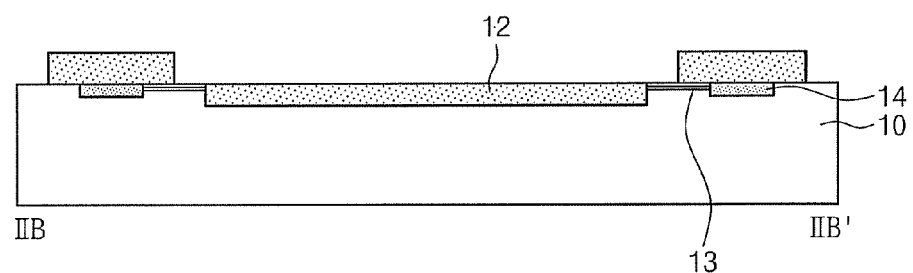
FIGS. 2B and 2C are cross-sectional views taken along lines IIB-IIB' and IIC-IIC' of FIG. 2A.
Figure 2C:
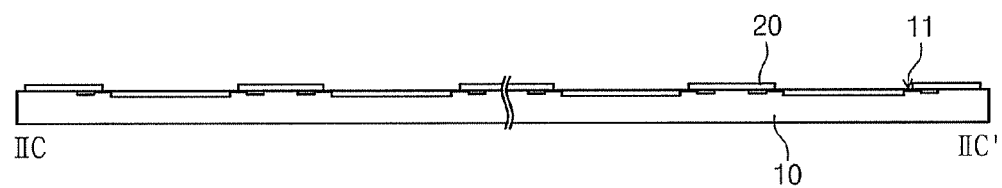

Referring to FIGS. 2A through 2C, an adhesive layer 20 may be formed on the pad electrodes 14 around the APS region 12. Here, the adhesive layer 20 may be formed by a photolithography process. For example, the adhesive layer 20 may be coated over the surface of the wafer 10. Thereafter, the adhesive layer 20 outside of the APS region 12 may be selectively exposed to ultraviolet rays through a photomask exposure process. In this case, the APS region 12 may not be selectively exposed to ultraviolet rays according to the type of the adhesive layer 20. Next, the adhesive layer 20 not exposed to the ultraviolet rays may be removed from the APS region 12 by chemical developer, with a portion of the adhesive layer 20 remaining outside of the APS region 12. Accordingly, the adhesive layer 20 may surround the entire APS region 12.

Figure 3A:
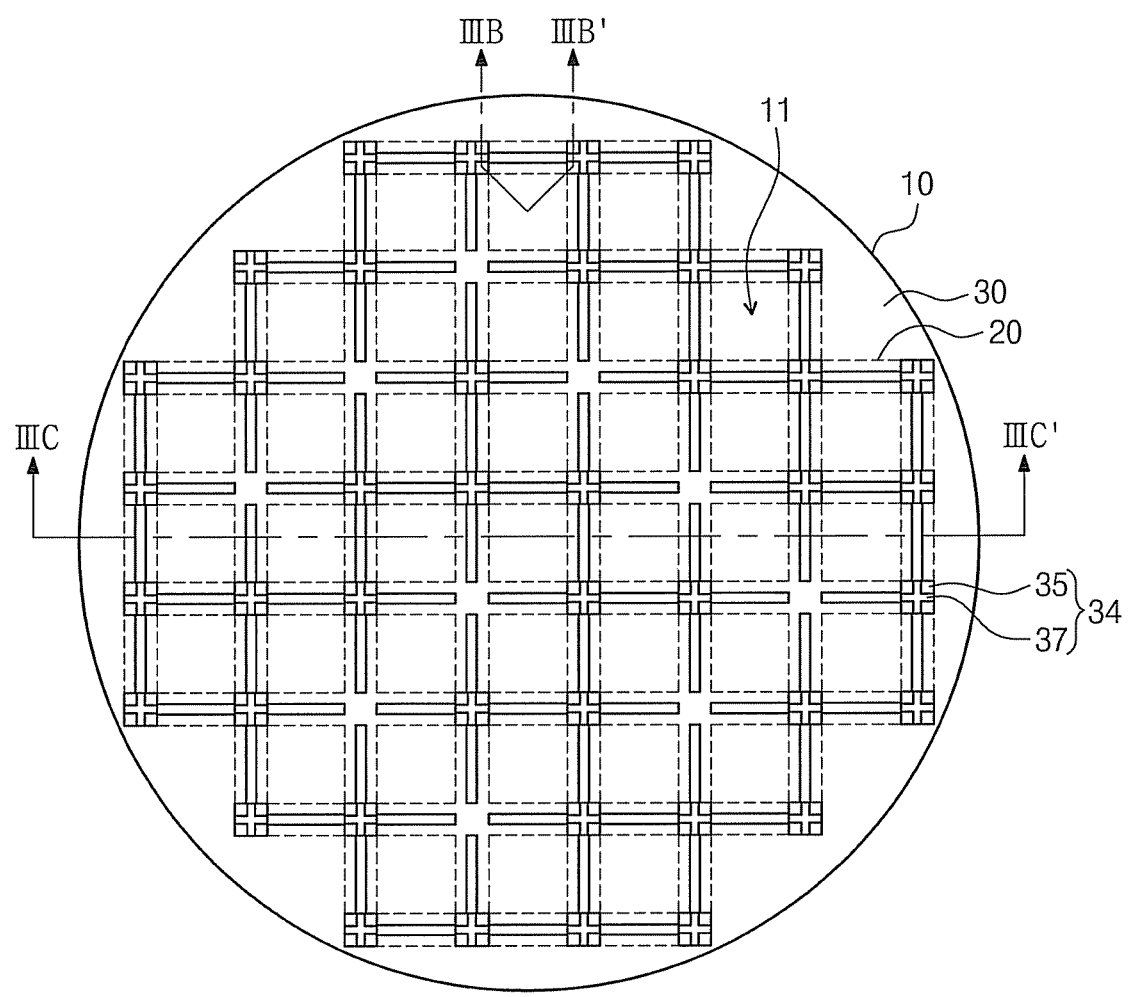
FIG. 3A is a diagram illustrating a wafer and a cover plate shown to describe a wafer level packaging method according to an example embodiment of the inventive concepts.
Figure 3B:
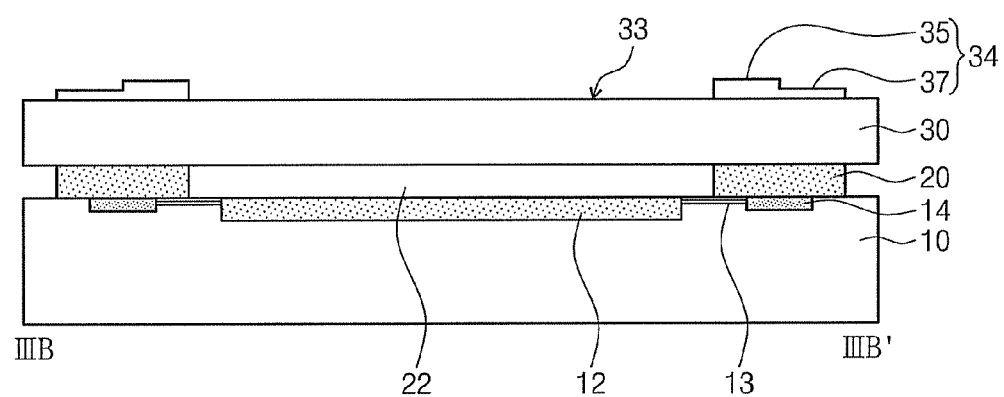
FIGS. 3B and 3C are cross-sectional views taken along lines IIIB-IIIB' and IIIC-IIIC' of FIG. 3A.
Figure 3C:
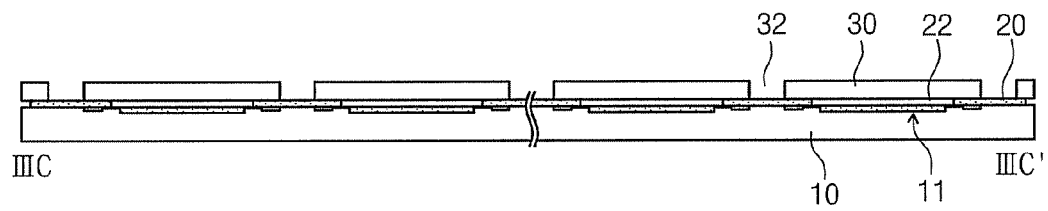

Referring to FIGS. 3A through 3C, a cover plate 30 having at least one line hole 32 may be attached to the adhesive layer 20. In this example embodiment, the at least one line hole 32 may be a plurality of line holes 32 arranged at boundaries of the plurality of semiconductor chips 11. Here, the cover plate 30 may be attached after being aligned with the wafer 10. For example, the cover plate 30 may be aligned such that the line holes 32 match the boundaries of the semiconductor chips 11. The line holes 32 may expose the adhesive layer 20 over the wafer 10 or the surface of the wafer 10 corresponding to the boundaries of the semiconductor chips 11. The cover plate 30 and the wafer 10 may be heated to a certain temperature that can increase the adhesive strength of the adhesive layer 20. The adhesive layer 20 may seal the APS region 12 together with the wafer 10 and the cover plate 30. Accordingly, the adhesive layer 20 may have a first gap 22 between the top surface of the APS region 12 and the undersurface of the cover plate 30. The first gap 22 may be filled with an inert gas of normal pressure.

The cover plate 30 may protect the APS regions 12 of the plurality of semiconductor chips 11 over the wafer 10. The cover plate 30 may comprise transparent materials that transmit light to the APS region 12 of the plurality of semiconductor chips 11. For example, the transparent materials may comprise glass and plastic. Generally, since plastic is mass-producible with injection-molding, plastic may be cheaper than glass. Plastic may have a thermal expansion coefficient of about 20 ppm/K. Accordingly, the cover plate 30 may comprise plastic materials such as polycarbonate, Fiber Reinforced Plastic (FRP), and Carbon Fiber Reinforced Plastic (CFRP). Since the cover plate 30 may be formed of plastic, which may be cheaper than glass, the wafer level packaging method according to the example embodiments of the inventive concepts, may increase or maximize productivity.

The cover plate 30 may comprise a plurality of line holes 32. For example, the line holes 32 may have openings exposing the surface of the wafer 10 or the adhesive layer 20 corresponding to four sides of the plurality of semiconductor chips 11 having a square shape except the corners thereof. The line holes 32 may have a line width of about 1 μm to about 10 μm. The line holes 32 may be arranged in a mesh shape over the cover plate 30.

The cover plate 30 may comprise protrusions 34 where the plurality of line holes 32 cross each other. The protrusion 34 may comprise a second planar surface 35 having a level higher than the first planar surface 33. The protrusion 34 may be formed to have a square or circular shape at an upper portion of the cover plate 30 corresponding to the boundaries of the plurality of semiconductor chips 11. The protrusion 34 may be formed in the cover plate 30 corresponding to the corners of the semiconductor chips 11 having a square shape. The protrusion 34 may be more intensively formed on the cover plate 30 corresponding to the edge of the wafer 10 than the center of the wafer 10. For example, the concentration of protrusions 34 may be greater near an outside edge of the wafer 10 than a middle region of the wafer 10. The protrusion 34 may comprise at least one groove 37 formed in a direction in which the plurality of line holes 32 extend. The groove 37 may be formed in a cross shape.

Figure 4:
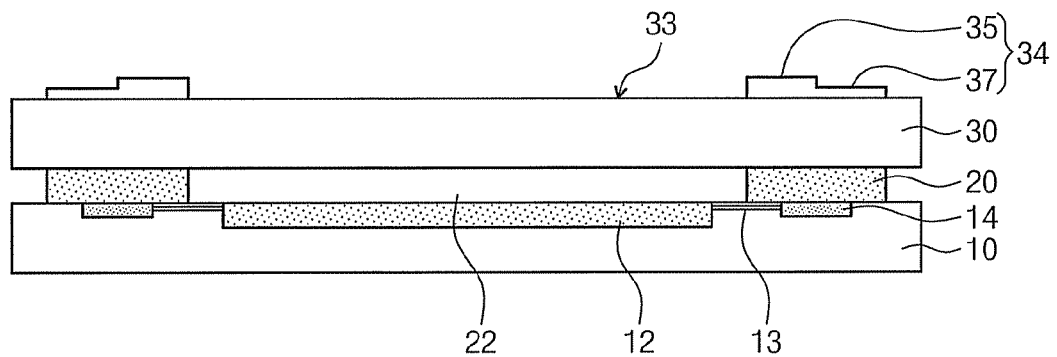
FIGS. 4 through 9 are cross-sectional views sequentially illustrating a process of forming a through electrode and an interconnection that are exposed under a wafer of FIG. 3B.

Referring to FIGS. 3A and 4, the undersurface of the wafer 10 may be relatively flat. Here, the undersurface of the wafer 10 may be flattened through grinding or Chemical Mechanical Polishing (CMP). For example, the wafer 10 may be flattened to have a thickness of about 10 μm to about 100 μm.

Figure 5:
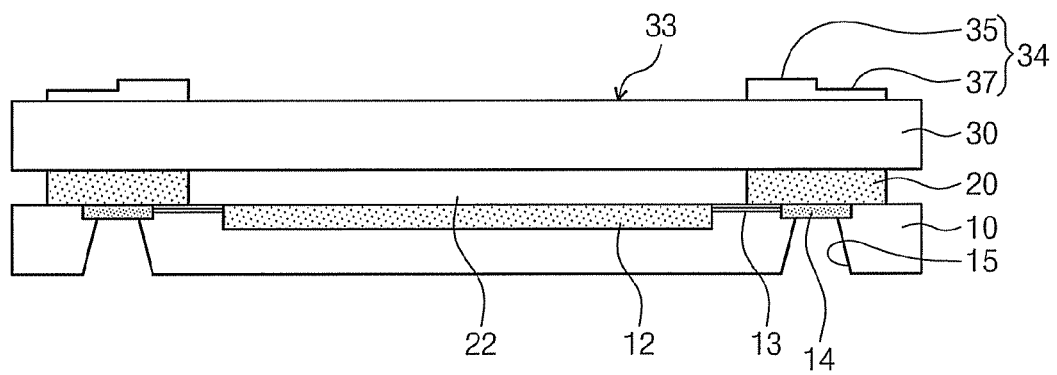

Referring to FIGS. 3A and 5, a portion of the wafer 10 under the pad electrode 14 may be removed to form a through hole 15. Here, the through hole 15 may expose the pad electrode 14 under the wafer 10 in a square or circular shape. For example, the through hole 15 may be formed by a photolithography process or laser punching. The photolithography process may comprise a photomask exposure process for forming a photoresist pattern as a mask selectively exposing the undersurface of the wafer 10 under the pad electrode 14 and a dry etching process for removing the wafer 10 under the pad electrode 14. The dry etching process may comprise a reactive ion etching process. Since the reactive ion etching process uses a reaction gas of a plasma state, the wafer 10 and the cover plate 30 may be exposed to high-temperature of about 100° C. The wafer 10 and the cover plate 30 may also be exposed to high temperature in a hard bake that dries the photoresist pattern during the photolithography process.

The line holes 32 of the cover plate 30 may prevent a bending defect of the wafer in a high-temperature process such as the photolithography process. The line holes 32 may minimize interferences according to shrinkage and expansion of the cover plate 30 over APS regions 12 adjacent to each other. That is, the line holes 32 may individually restrict the shrinkage and expansion of the cover plate 30 for each APS region 12. Accordingly, the line holes 32 may allow the cover plate 30 of plastic material having a relatively higher thermal expansion coefficient than silicon to expand and shrink independently for each APS region 12.

Accordingly, since the wafer level package method according to the example embodiments of the inventive concepts can prevent a bending defect of the wafer 10 caused by a thermal expansion coefficient difference between the wafer 10 and the cover plate 30 using the line holes 32 formed in the cover plate 30, production yield may be enhanced or maximized.

Figure 6:
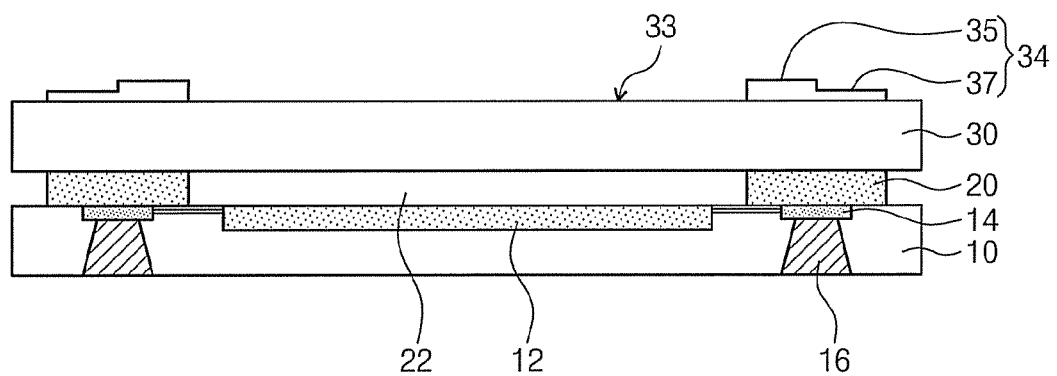

Referring to FIGS. 3A and 6, a through electrode 16 may be formed in the through hole 15. The through electrode 16 may be formed to be exposed downward from the wafer 10. For example, the through electrode 16 may be formed in the undersurface of the wafer 10 through a metal deposition process such as sputtering and Chemical Vapor Deposition (CDV). The through electrode 16 may also be formed in the through hole 15 through CMP or dry etching. The metal deposition process and the dry etching process may expose the wafer 10 and the cover plate 30 to high temperature of about 50° C. or more. Accordingly, the wafer level package method according to this example embodiment of the inventive concepts can prevent a bending defect of the wafer 10 according to a thermal expansion coefficient difference between the wafer 10 and the cover plate 30 using the line holes 32 of the cover plate 30.

Figure 7:
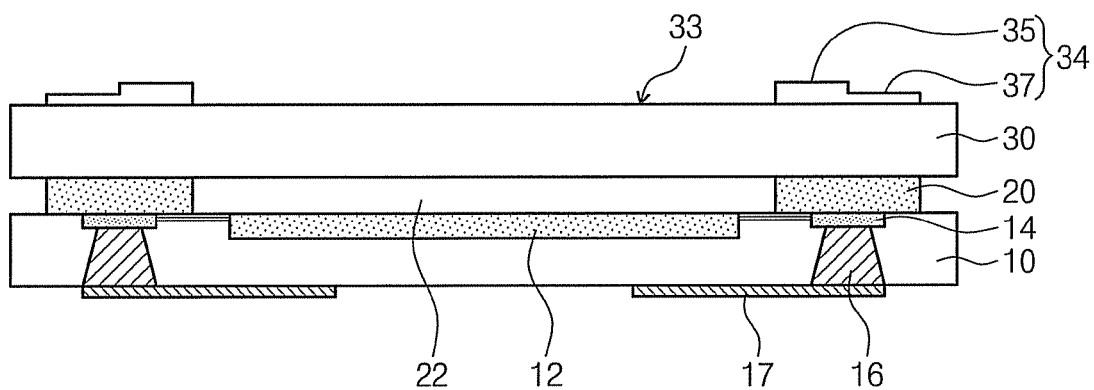

Referring to FIGS. 3A and 7, a rewiring pattern 17 connected to the through electrode 16 under the wafer 10 may be formed. Here, the rewiring pattern 17 may be formed under the wafer 10 through a metal deposition process and a photolithography process. For example, a deposition process of a conductive metal layer may comprise a sputtering process or a CVD process. The photolithography process may comprise a photomask exposure process for forming a photoresist pattern selectively exposing a conductive metal layer and a dry etching process for removing the exposed conductive metal layer from the photoresist pattern. The dry etching process, the sputtering process, and the CVD process may expose the wafer 10 and the cover plate 30 to a high-temperature reaction gas of a plasma state. Also, the wafer and the cover plate 30 may also be exposed to high temperature in a hard bake that dries the photoresist pattern during the photomask exposure process.

Accordingly, the wafer level package method according to the example embodiments of the inventive concepts can prevent a bending defect of the wafer 10 caused by a thermal expansion coefficient difference between the wafer 10 and the cover plate 30 in a high temperature flip chip process using the line holes 32 formed in the cover plate 30.

Figure 8:
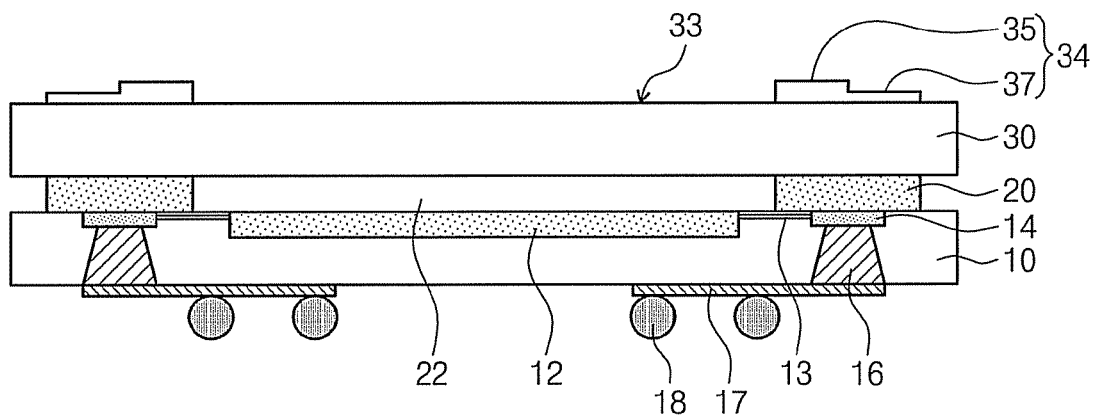

Referring to FIGS. 3A and 8, at least one solder ball 18 connected to the rewiring pattern 17 may be formed. Here, the solder ball 18 may be mechanically or electrically connected to the rewiring pattern 17. For example, the solder ball 18 may have a spherical shape of about 100 μm or less.

Figure 9:
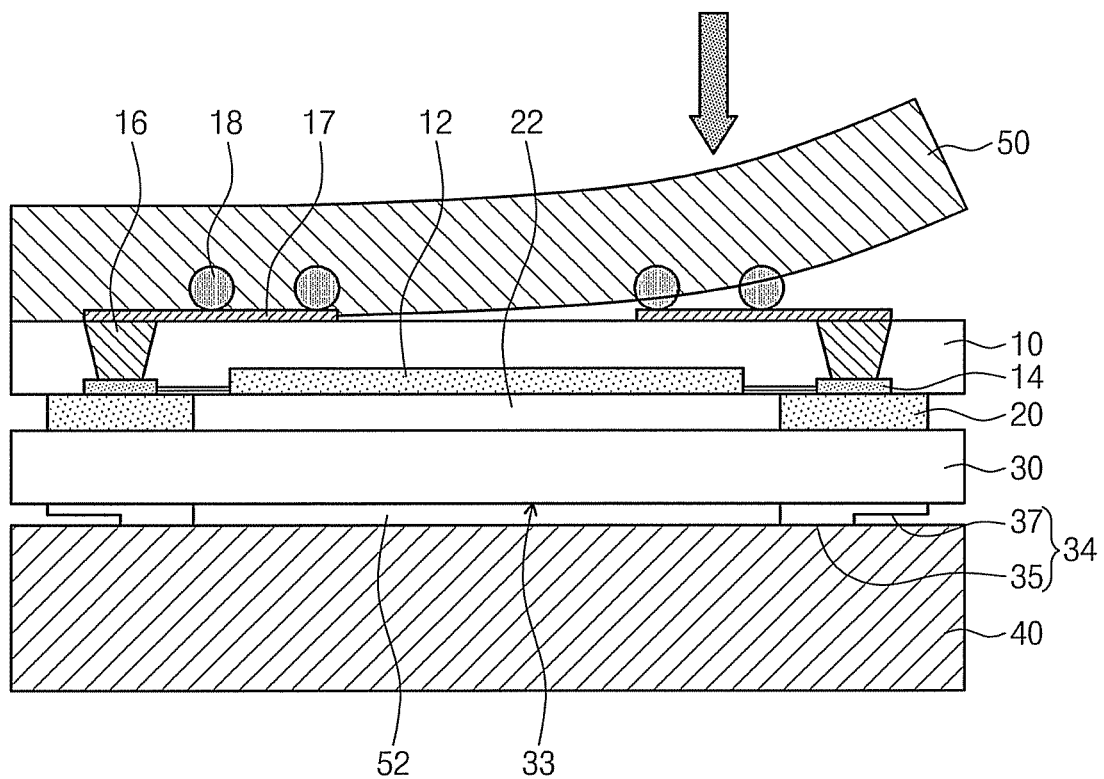

Referring to FIGS. 3A and 9, the cover plate 30 may be seated on a chuck 40 to attach a tape 50 to the wafer 10. The wafer 10 and the cover plate 30 may be inversely seated on the chuck 40. The protrusion 34 of the cover plate 30 may be supported by the flat chuck 40. The protrusion 34 may minimize a contact area of the cover plate 30 supported by the flat chuck 40. The protrusion 34 may form a second gap 52 between the first planar surface 33 of the cover plate 30 and the chuck 40. Since the first planar surface 33 of the cover plate 30 corresponding to the APS region 12 of the wafer 10 is spaced apart from the chuck 40, a scratch defect may be prevented or reduced. Accordingly, the protrusion 34 may prevent a scratch (or reduce scratching) at the first planar surface 33 of the cover plate 30 corresponding to the APS region 12. For example, the protrusion 34 may become a scratch prevention bump that prevents a scratch (or reduces scratching) by spacing the first planar surface of the cover plate 30 from the chuck 40.

Accordingly, since the wafer level package method according to the example embodiment of the inventive concepts can prevent or reduce a scratch in the corresponding cover plate 30 over the APS region 12 using the protrusion 34 to the outside of the APS region 12, production yield may be enhanced or maximized.

Thereafter, the tape 50 may be attached to the wafer 10. The chuck 40 may support the protrusion 34 of the cover plate 30 upon attachment of the tape 50 to the wafer 10. The arrow shown in FIG. 9 indicates the attachment direction of the tape 50. The tape 50 may prevent the semiconductor chips 11 from separating individually after the wafer 10 is diced into the plurality of semiconductor chips 11. The solder ball 18 and the rewiring pattern 17 on the undersurface of the wafer 10 may be attached to the tape 50. For example, the tape 50 may comprise an adhesive ingredient that loses adhesive strength when exposed to ultraviolet rays.

Figure 10A:
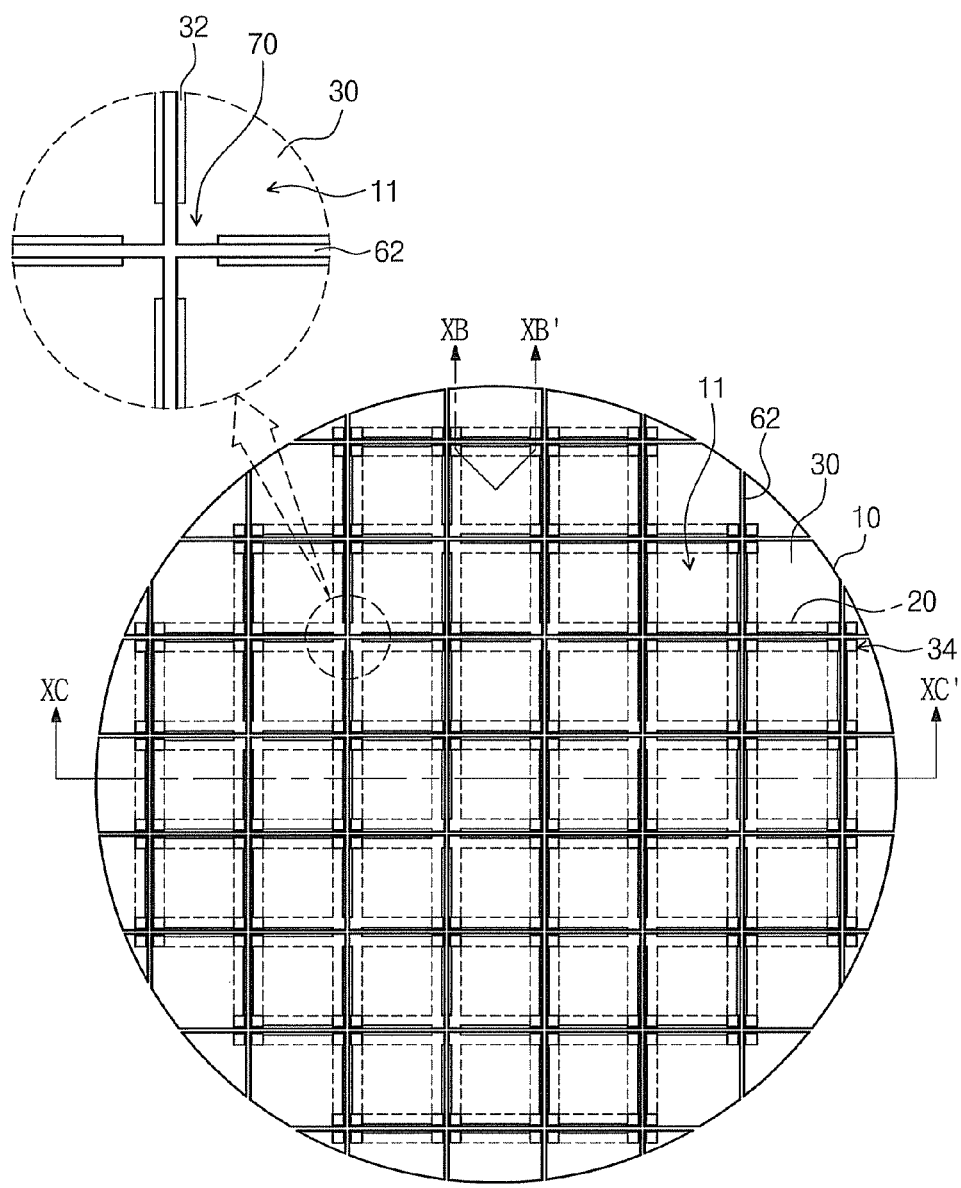
FIG. 10A is a diagram illustrating a wafer and a cover plate shown to describe a wafer level packaging method according to an example embodiment of the inventive concepts.
Figure 10B:
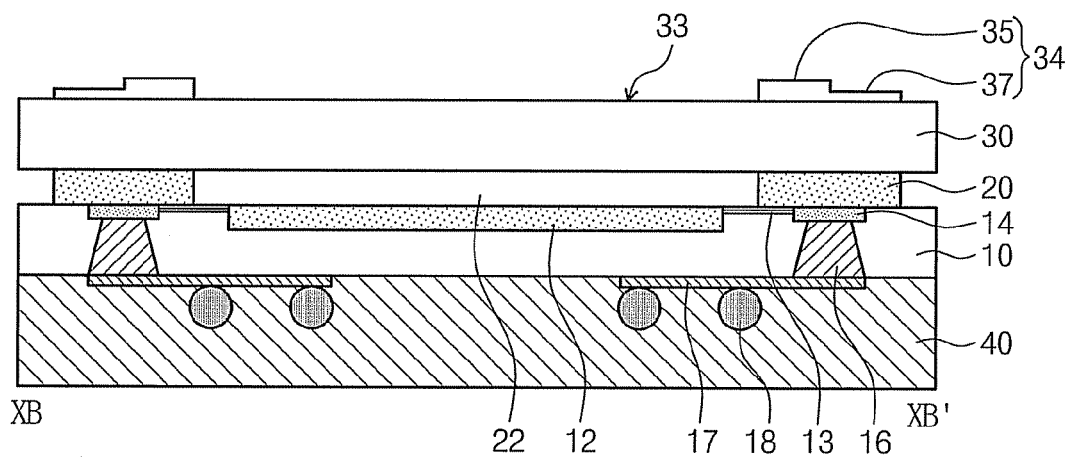
FIGS. 10B and 10C are cross-sectional views taken along XB-XB' and XC-XC' of FIG. 10A.
Figure 10C:
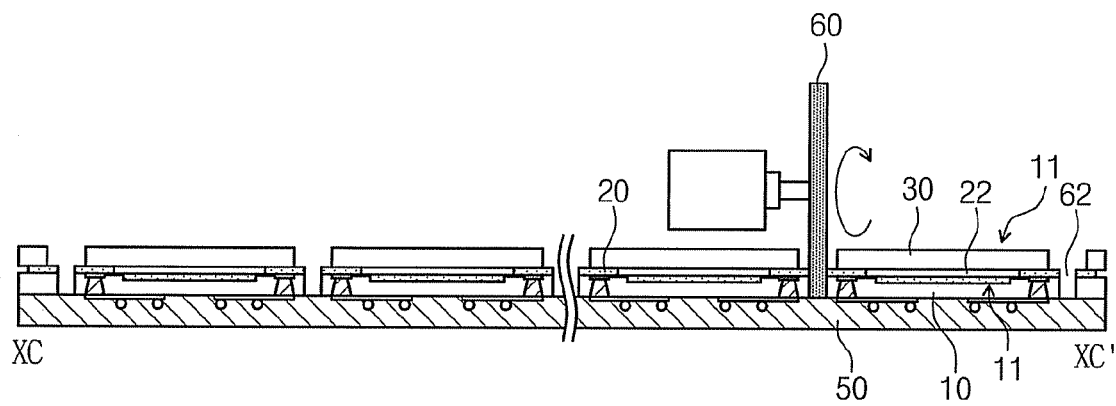

Referring to FIGS. 10A through 10C, the wafer 10 may be diced into the plurality of semiconductor chips 11 by a saw 60. Here, the saw 60 may cut the wafer 30 and the cover plate 30 along a cutting region 62. The line holes 32 may guide the saw 60 or a cutter upon dicing of the plurality of semiconductor chips 11. Also, the saw 60 or a cutter may be guided by the groove 37 of the protrusion 34. Since the line holes 32 and the groove 37 help the dicing of the plurality of semiconductor chips 11, the sawing speed and the dicing speed of the wafer 10 may increase. In this case, when the line width of the line holes 32 is greater than that of the cutting region 62, the cover plate 30 may comprise at least one edge 70 remaining at the corner of the plurality of semiconductor chips 11. Also, when the protrusion 34 of the cover plate 30 is formed smaller than the cutting region 62, the protrusion 34 of the cover plate 30 may be completely removed.

Accordingly, since the wafer level packaging method according to this example embodiment of the inventive concepts can increase the sawing speed and the dicing speed of the wafer 10 using the line holes 32 arranged along the boundaries among the plurality of semiconductor chips 11, productivity may be enhanced or maximized.

Although not shown, when the wafer 10 is diced into the plurality of semiconductor chips 11, ultraviolet rays may be irradiated on the tape 50 to remove or reduce the adhesive strength of the tape 50, and then the plurality of semiconductor chips 11 may be separated from the tape 50.

According to the example embodiments of the inventive concepts, productivity may be enhanced or maximized using a cover plate of cost-saving materials.

Also, since a wafer bending defect due to a thermal expansion coefficient difference between a wafer and a cover plate may be prevented or reduced by a cover plate comprising line holes exposing a wafer or an adhesive layer at boundaries between a plurality of chips, production yield may be enhanced or maximized.

Furthermore, since a scratch can be prevented or reduced in a taping process by comprising a protrusion portion upwardly protruded from a portion where line holes cross each other and separating a planar surface of a cover plate corresponding to an active pixel sensor region from a chuck, production yield can be enhanced or maximized.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A wafer level package method comprising:
    forming an adhesive layer on a substrate, the substrate including a plurality of chips and the adhesive layer is formed on boundaries of the plurality of chips; and
    attaching a cover plate to the substrate via the adhesive layer, the cover plate including at least one opening exposing at least one of the adhesive layer and the substrate at the boundaries of the plurality of chips,
    wherein the at least one opening includes at least one line hole corresponding to at least one of the boundaries of the plurality of chips, and the at least one line hole is a plurality of line holes, the plurality of line holes discontinuously formed and corresponding to the boundaries of the plurality of chips.

2. The wafer level package method of claim 1, wherein the cover plate includes plastic.

3. The wafer level package method of claim 2, wherein the plastic comprises at least one of polycarbonate, Fiber Reinforced Plastic (FRP), and Carbon Fiber Reinforced Plastic (CFRP).

4. The wafer level package method of claim 3, further comprising:
    forming a through electrode in the substrate; and
    forming a wiring pattern on a bottom surface of the substrate.

5. The wafer level package method of claim 1, wherein the plurality of chips have a polygonal shape and the line holes are formed at sides of the plurality of chips.

6. The wafer level package method of claim 5, wherein the line holes are configured to reduce shrinkage and expansion of the cover plate and the plurality of chips.

7. The wafer level package method of claim 1, wherein the plurality of line holes are arranged in a mesh shape.

8. The wafer level package method of claim 7, further comprising:
    dicing the substrate into the plurality of chips along the plurality of line holes.

9. The wafer level package method of claim 1, wherein the cover plate further comprises at least one protrusion where the plurality of line holes cross each other.

10. The wafer level package method of claim 9, wherein attaching the cover plate to the substrate includes aligning the cover plate with the substrate so that the at least one protrusion is arranged at a corner of at least one chip of the plurality of chips.

11. The wafer level package method of claim 10, further comprising:
    seating the at least one protrusion of the cover plate on a chuck; and
    attaching a tape on an undersurface of the substrate.

12. The wafer level package method of claim 11, wherein the at least one protrusion prevents a planar surface of the cover plate from contacting the chuck.

13. The wafer level package method of claim 12, wherein the at least one protrusion is a plurality of protrusions distributed such that the plurality of protrusions are more intensively disposed at edges of the cover plate than a center thereof.

14. The wafer level package method of claim 9, wherein the at least one protrusion has at least one groove aligned with at least one line hole.

15. The wafer level package method of claim 14, wherein the groove forms a cross shape at the protrusion.

16. The wafer level package method of claim 9, further comprising:
dicing the substrate into the plurality of chips along the plurality of line holes, during which the at least one protrusion is removed.

\* \* \* \* \*